(12) United States Patent
Nandigam et al.

(10) Patent No.: US 10,310,457 B2
(45) Date of Patent: Jun. 4, 2019

(54) RUNTIME MODELING APPROACH TO UPDATING REFINERY PLANNING MODELS

(71) Applicant: Aspen Technology, Inc., Burlington, MA (US)

(72) Inventors: Ravi Nandigam, Woburn, MA (US); Ajay Modi, Newton, MA (US); Marcelo Marchetti, Cambridge, MA (US); Willie Chan, Framingham, MA (US)

(73) Assignee: Aspen Technology, Inc., Bedford, MA (US)

(*) Notice: Subject to any disclaimer, the term of this patent is extended or adjusted under 35 U.S.C. 154(b) by 1008 days.

(21) Appl. No.: 14/551,334

(22) Filed: Nov. 24, 2014

(65) Prior Publication Data

US 2016/0147202 A1 May 26, 2016

(51) Int. Cl.
*G06Q 10/06* (2012.01)
*G05B 13/04* (2006.01)
(Continued)

(52) U.S. Cl.
CPC ..... *G05B 13/041* (2013.01); *G05B 19/41865* (2013.01); *G06Q 10/063* (2013.01); (Continued)

(58) Field of Classification Search
None
See application file for complete search history.

(56) References Cited

U.S. PATENT DOCUMENTS 5,024,801 A 6/1991 Impink, Jr. et al.
6,047,221 A 4/2000 Piche et al.
(Continued)

FOREIGN PATENT DOCUMENTS

WO WO 2016/085523 A1 6/2016

OTHER PUBLICATIONS

Notification of Transmittal of the International Preliminary Report on Patentability for Int'l Application No. PCT/US2014/071379, "Runtime Modeling Approach to Updating Refinery Planning Models," dated Jun. 8, 2017.
(Continued)

*Primary Examiner* — Craig C Dorais
(74) *Attorney, Agent, or Firm* — Hamilton, Brook, Smith & Reynolds, P.C.

(57) ABSTRACT

A method, apparatus, and computer program product for increasing efficiency in a plant by creating a planning model for said plant comprising a plurality of runtime models stored in a database. Each runtime model corresponds to a reactor in the plant and mimics real world behavior of the reactor by identifying the mathematical relationships of the inputs and outputs of the reactor. Each runtime model further comprises a set of tuning factors, which allows the user to adjust the runtime model to more closely align with the user's desired output or otherwise account for real-life plant activity. By properly creating and utilizing a plurality of runtime models and implementing them into a planning model, a user can increase efficiency of the plant by optimizing product output, forcing the plant to balance materials-in and materials-out, or forcing the plant to stoichiometrically balance elements going in, and coming out of the plant or reactor.

23 Claims, 10 Drawing Sheets

(51) Int. Cl.
*G05B 19/418* (2006.01)
*G06F 17/50* (2006.01)
*G05B 17/02* (2006.01)

(52) U.S. Cl.
CPC .......... *G05B 17/02* (2013.01); *G06F 17/5009* (2013.01); *Y02P 90/20* (2015.11); *Y02P 90/26* (2015.11)

(56) References Cited

U.S. PATENT DOCUMENTS

| | | | |
|---|---|---|---|
| 8,942,963 B1* | 1/2015 | Kanthasamy | G06F 17/5009 703/6 |
| 2005/0089831 A1 | 4/2005 | Russell, II et al. | |
| 2007/0143083 A1 | 6/2007 | Kropaczek et al. | |
| 2007/0153958 A1 | 7/2007 | Russell, II et al. | |
| 2009/0120842 A1* | 5/2009 | Koseoglu | C10G 25/003 208/250 |
| 2011/0264415 A1 | 10/2011 | Bleackley et al. | |
| 2013/0179235 A1* | 7/2013 | Treiber | G05B 11/32 705/7.41 |

OTHER PUBLICATIONS

Notification of Transmittal of the International Search Report and the Written Opinion of the International Searching Authority for Int'l Application No. PCT/US2014/071379, "Runtime Modeling Approach to Updating Refinery Planning Models," dated Aug. 17, 2015.

International Search Report of the International Searching Authority for Int'l Application No. PCT/US2014/071379, "Runtime Modeling Approach to Updating Refinery Planning Models," dated Aug. 17, 2015.

Written Opinion of the International Searching Authority for Int'l Application No. PCT/US2014/071379, "Runtime Modeling Approach to Updating Refinery Planning Models," dated Aug. 17, 2015.

"Process Simulation for Planning," AspenTech, available at http://www.aspentech.com/publication_files/article_process_simulation_for_planning_nov_2006.pdf (last accessed Dec. 16, 2014).

"Rigorous process models improve profits in Louisiana refinery," Oil & Gas Journal, Nov. 8, 2004, available at http://www.ogj.com/articles/print/volume-102/issue-42/special-report/rigorous-process-models-improve-profits-in-louisiana-refinery.html (last accessed Dec. 16, 2014).

G. Al-Enezi, et al., "Development of Regression Models to Control Product Yields and Properties of the Fluid Catalytic Cracking Process," Petroleum Science and Technology, 17(5&6): 535-552 (1999).

Sanjeev Mullick, et al., "Benefits of Integrating Process Models with Planning and Scheduling in Refining Operations," AspenTech, available at http://www.aspentech.com/Benefits_of_Integrating_process_Models_with_Planning_and_Scheduling.pdf (last accessed Dec. 16, 2014).

I. Alhajri & A. Elkamel, "A nonlinear programming model for refinery planning and optimisation with rigorous process models and product quality specifications," Int. J. Oil, Gas and Coal Technology, 1(3): 283-307 (2008).

A. Elkamel, et al., "Modeling the Hydrocracking Process Using Artificial Neural Networks," Petroleum Science and Technology, 17(9&10): 931-354 (1999).

\* cited by examiner

RUNTIME MODELING APPROACH TO UPDATING REFINERY PLANNING MODELS

BACKGROUND OF THE INVENTION

The refining industry experiences volatility in areas such as crude supply and demand fluctuations, product availability and pricing, and refining margins. Refiners must, therefore, optimize the refining process in the face of limited crude supply to produce product or otherwise increase profitability. A refiner or planner, generally, can create a plan which identifies a potential refining margin that will allow the refiner to take advantage of a wide variety of crude materials while still aiming to meet product demand. A poor plan, however, can cause sub-par refinery performance and lower product margins, whereas a high-quality plan will result in optimal performance and larger product returns. Refinery reactors are complex unit operations, however, and unforeseen circumstances can turn a high-quality plan into a poor plan.

SUMMARY OF THE INVENTION

To assist planners in creating high-quality plans in the face of unforeseen circumstances, a new method, apparatus, and computer program product are disclosed for increasing efficiency in a refinery or processing plant, such that the refiner can optimize product returns or efficient use of crude materials.

Accordingly, in a first aspect, the present invention is a method, apparatus, or computer program product for increasing efficiency in a processing plant, the method, apparatus, or computer program product comprising, by a processor: from a source of templates, identifying a template corresponding to a configuration of a reactor, wherein each template comprises a set of pre-defined independent variables and a set of pre-defined dependent variables; creating a rigorous reactor model, said rigorous reactor model comprising the set of pre-defined independent variables and the set of pre-defined dependent variables in the identified template; using a simulator, running the rigorous reactor model with possible candidate values for the set of pre-defined independent variables and the set of pre-defined dependent variables to identify a set of relationships between the set of pre-defined independent variables and the set of pre-defined dependent variables; building a runtime model using the identified set of relationships between the set of pre-defined independent variables and the set of pre-defined dependent variables; and storing the runtime model on a database. The runtime models further comprise a set of tuning factors, and implementation of results produced by at least one of the runtime models into a planning model increases efficiency in the plant.

In another embodiment, running at least one of the runtime models results in material balance for the corresponding reactor.

In another embodiment, running at least one of the runtime models results in elemental balance for the corresponding reactor.

In another embodiment, the runtime models are shared between an engineering environment and a planning environment.

In another embodiment, the runtime models in the database are organized according to reactor type.

In another embodiment, the templates correspond to the configuration of a reactor selected from one of the following types of reactors: a fluid catalytic cracking unit, a hydrocracker, a coker, a reformer, and a visbreaker. Other reactor types are suitable as well.

In another embodiment, the method, apparatus, or computer program product further comprise creating a plurality of linear relationships from the runtime models.

In a second aspect, the present invention is a method, apparatus, or computer program product for increasing efficiency in a processing plant, the method, apparatus, or computer program product comprising, by a processor: creating a planning model comprising a set of model parameters that models a configuration of a plurality of reactors in the plant; receiving (or otherwise accessing), from a database, at least one of a plurality of runtime models corresponding to at least one reactor of the plurality of plant reactors, wherein for each runtime model, the runtime model comprises a set of relationships between a set of pre-defined independent variables and a set of pre-defined dependent variables that correspond to real-world behavior, and a set of tuning factors; running the received runtime models to update the set of planning model parameters such that the planning model behavior corresponds to real-world behavior of the plurality of reactors in the plant, thereby creating an updated planning model; and applying the updated planning model to increase efficiency in the plant.

In another embodiment, the runtime models are incorporated directly into the planning model for representing corresponding reactors in the plant.

In another embodiment, prior to running the received runtime models, tuning the received runtime models by adjusting the set of tuning factors such that the runtime models correspond to real-life behavior of one of the plurality of reactors.

In another embodiment, wherein running the received runtime models produces a dataset corresponding to real-world behavior of the plurality of reactors in the plant.

In another embodiment, the set of model parameters are updated using the produced dataset.

In another embodiment, prior to running the received runtime models, tuning the runtime models by adjusting the set of tuning factors are according to advanced process control model information.

In another embodiment, the advanced process control model information includes steady-state gains.

In another embodiment, the advanced process control model information includes a base operating point.

In another embodiment, prior to running the received runtime models, tuning the runtime models by adjusting the set of tuning factors according to plant historical data.

In another embodiment, the plurality of runtime models in the database are organized according to reactor type.

In another embodiment, each of the plurality of reactor models is selected from one of the following types of reactors: a fluid catalytic cracking unit, a hydrocracker, a coker, a reformer, and a visbreaker. Other reactor types are suitable as well.

In another embodiment, the method, apparatus, or computer program product further comprise creating a plurality of linear relationships from the runtime models.

In another embodiment, the plurality of linear relationships are incorporated into the planning model.

In a third aspect, the present invention is a method, apparatus, or computer program product for increasing efficiency in a processing plant, the method comprising, by a processor: creating a planning model that models a configuration of a plurality of reactors in the plant; receiving (or otherwise accessing), from a database, at least one of a plurality of runtime models corresponding to at least one reactor of the plurality of reactors, wherein for each runtime model, the runtime model comprises a set of relationships between a set of pre-defined independent variables and a set of pre-defined dependent variables that correspond to real-world behavior, and a set of tuning factors. The runtime models being created by: from a source of templates, identifying a template corresponding to a configuration of a reactor, wherein each template comprises a set of pre-defined independent variables and a set of pre-defined dependent variables; creating a rigorous reactor model, said rigorous reactor model comprising the set of pre-defined independent variables and the set of pre-defined dependent variables in the identified template; using a simulator, running the rigorous reactor model with possible candidate values for the set of pre-defined independent variables and the set of pre-defined dependent variables to identify a set of relationships between the set of pre-defined independent variables and the set of pre-defined dependent variables; building the runtime model using the identified set of relationships between the set of pre-defined independent variables and the set of pre-defined dependent variables; and storing the runtime model on a database. The runtime models further comprise a set of tuning factors. Running the received runtime models updates the set of model parameters inside the planning model such that the planning model corresponds to real-world behavior of the plurality of reactors in the plant; and applying the updated planning model increases efficiency in the plant.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of example embodiments of the invention follows.

Planning Models

The present invention is directed to a method, apparatus, or computer program product for increasing efficiency in a refinery or a processing plant. Many processing plants rely on the use of a planning model to make key economic decisions such as selection of crudes oils for processing, production targets for refinery end products, and key process operation settings, which effect refinery margins. The planning model contains information related to different feeds and outputs and their relationships for each reactor as well as for the overall plant or refinery, referred to herein as a set of "model parameters." The planning model can be updated using a plurality of runtime models (described in more detail below), which are models of individual reactors and different configurations of individual reactors, within the plant or refinery. By manipulating the feeds selection and the conditions of each reactor within a refinery, for example, the planner can optimize output from the plant or refinery. Creating a "good" planning model depends on how accurately the model captures the input-output relationships (and real-world behavior) of the reactors they model.

Runtime Models

A runtime model (also referred to as a "reduced-order model"), is a model of a configuration of a specific reactor or reactors. Runtime models are built from rigorous simulation models ("rigorous reactor models") and are delivered in a database, such as a software package or made available to planners via a cloud computing system, or similar computer network. A rigorous reactor model is a real-world model of a specific reactor or reactor configuration, or a "first principles models," based on detailed modeling of the chemistry, kinetics, and thermodynamics of the reactors. The runtime model, in comparison, mimics the rigorous model by just capturing the input-output behavior of the rigorous model in the form of mathematical relationships. These mathematical relationships can be, for example, simple algebraic relationships of a linear or nonlinear fashion, or otherwise extrapolated from a dataset of inputs and outputs within a reactor via a neural network (described in more detail below).

Figure 1:
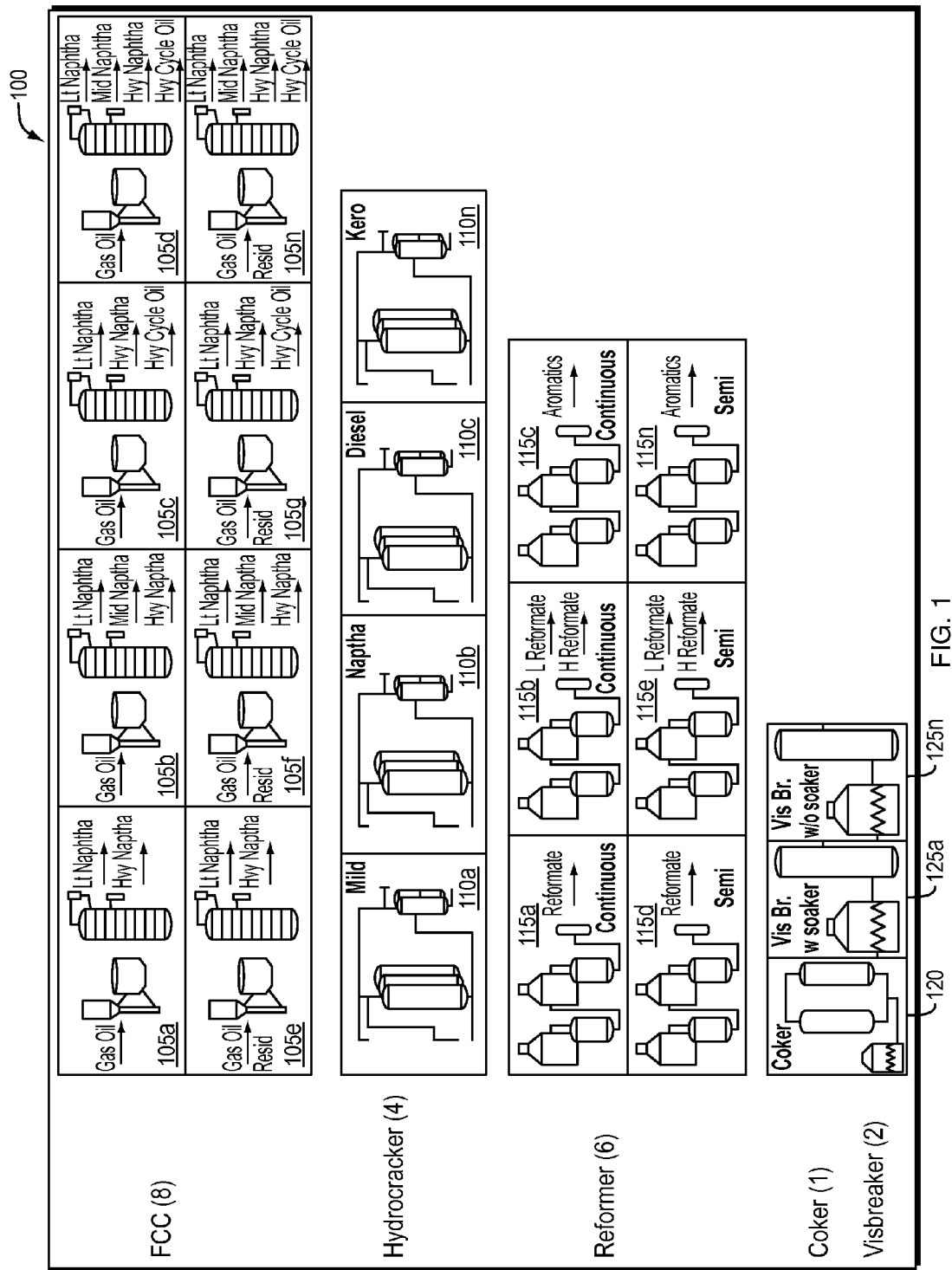
FIG. 1 is an illustration of a plurality of templates corresponding to configurations of a plurality of reactors.

FIG. 1 is an illustration of example templates 100 which correspond to different configurations of reactors and are used to build the rigorous (and subsequently the runtime) reactor models. The example templates 100 include templates for fluid catalytic cracking (FCC) units 105a-n, hydrocrackers 110a-n, reformers 115a-n, a coker 120, and visbreakers 125a-n stored in a template source (e.g., a datastore, or a database, or the like). Additional reactor types can also be included, such as hydrotreaters, alkylation units, and isomerization units. Likewise, per reactor type, any member of reactor configurations may be included. A person having skill in the art would recognize a potential reactor or reactor configuration that could be used in the context of the present invention. The illustrated template palette 100 lists 21 templates for 5 different reactor types, but many more templates for more reactor configurations/reactor types can exist in the template source. For example, the template database or template source can store 10 or more templates.

In another embodiment, the template database or template source can store 20 or more templates. In another embodiment, the template database or template source can store 30 or more templates; and so on. A person having ordinary skill in the art would readily recognize that any number of templates corresponding to any number of reactor configurations could exist within the context of the present invention.

Figure 2A:
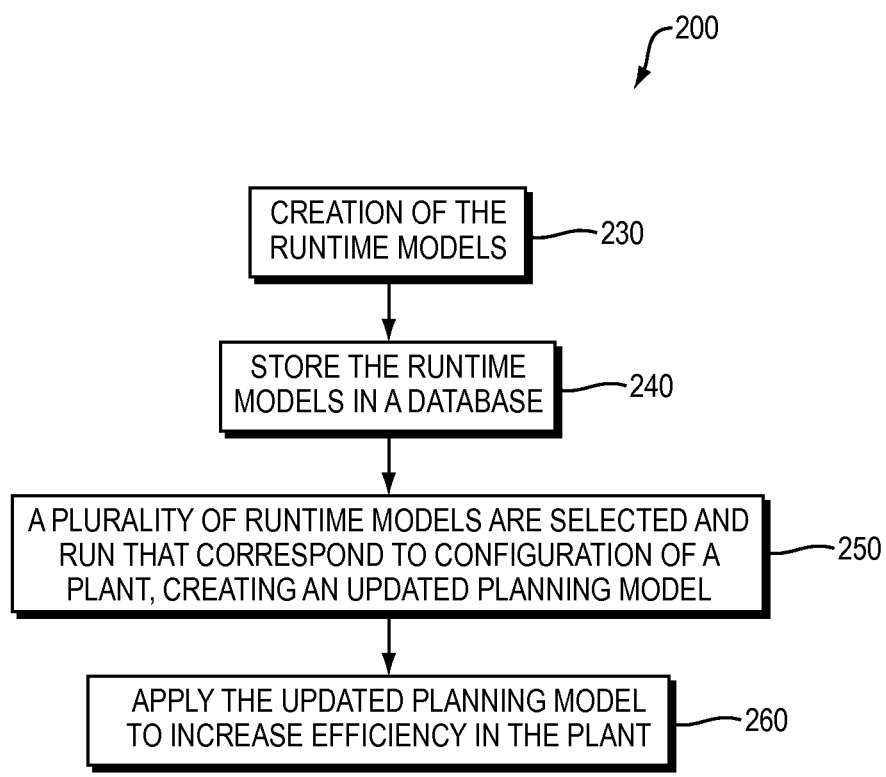
FIGS. 2a-c are flow charts of example algorithms for creating runtime models representing reactors and updating a planning model after running the runtime models in example embodiments of the present invention.
Figure 2B:
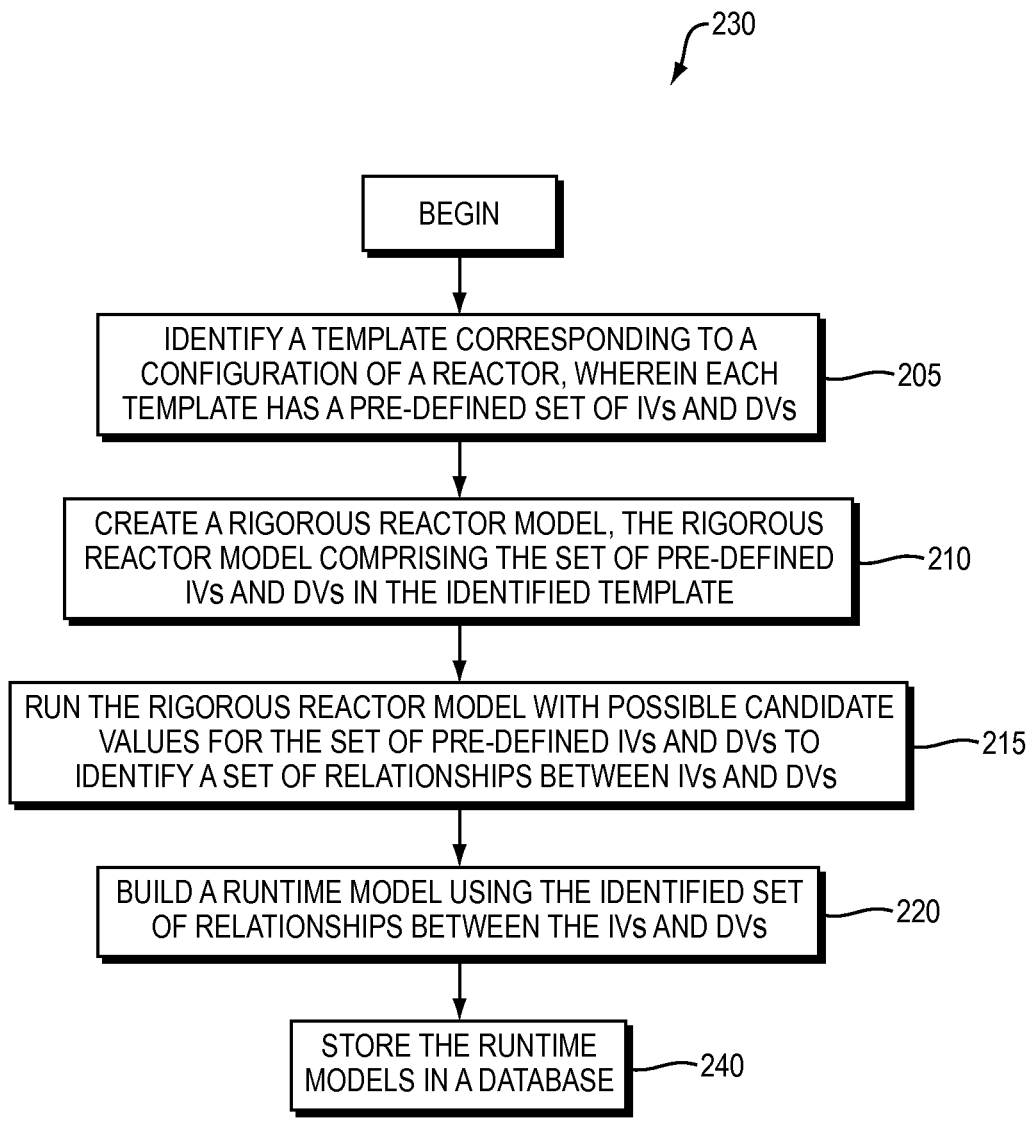
Figure 2C:
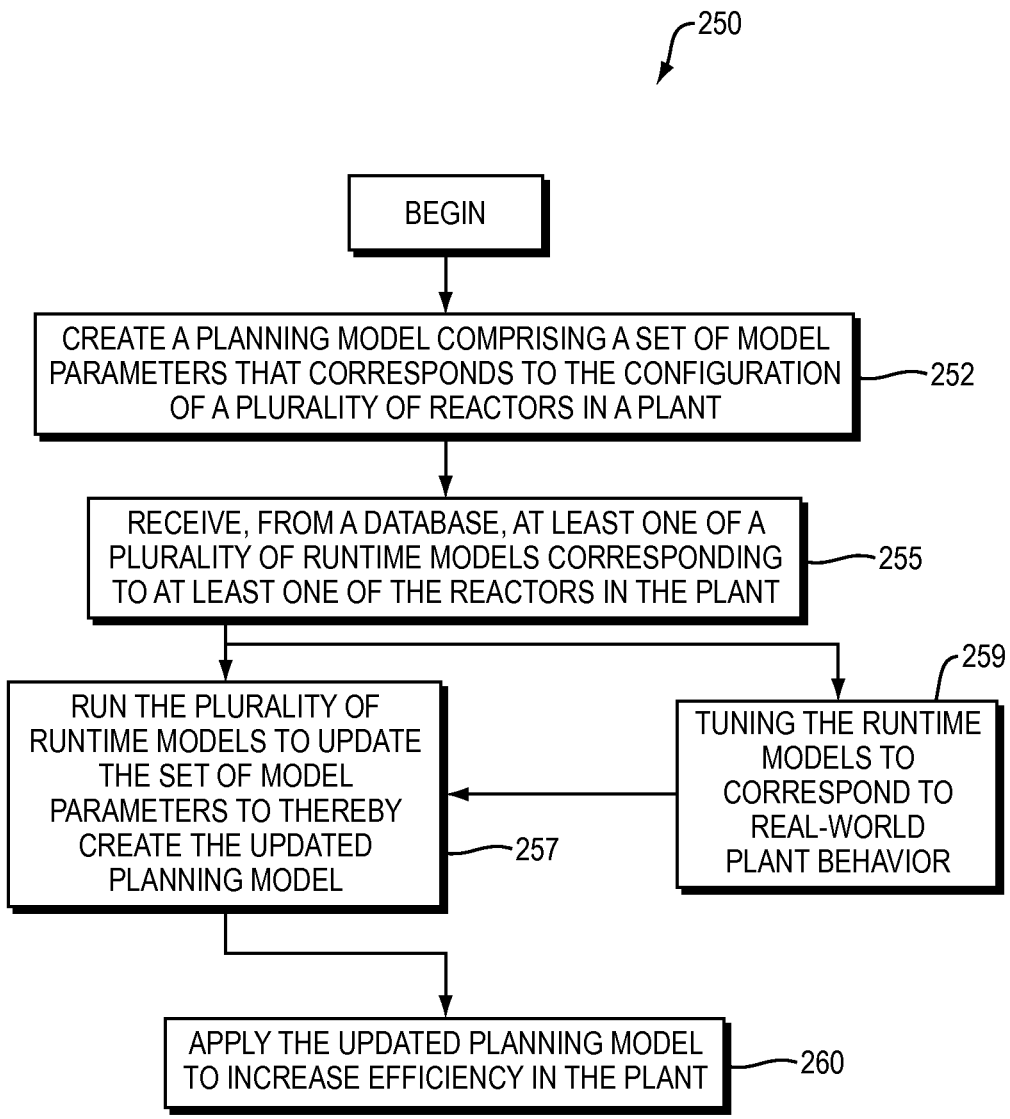

As described above, the planning model can be updated by running a plurality of runtime models, each runtime model corresponding to one of a plurality of reactors in a processing plant or a refinery. FIGS. 2a-c are flow charts of non-limiting example algorithms for creating runtime models and updating the planning model. FIG. 2a is a flow chart 200 of an overview of the creation of runtime models, the updating of the planning model using the runtime models, and the application of the updated planning model in a processing plant or a refinery. The runtime models are created 230 using data analytics tools such as, for example Applicant's data analytics tool Aspen-IQ™. The runtime models are then stored in a database 240. In one embodiment, the algorithm at process 230 for creating the runtime models is detailed in FIG. 2b, below. Runtime models are then selected which correspond to the configuration of a reactor or plurality of reactors in a plant or refinery 250. For example, a specific runtime model can correspond to a specific configuration of a reactor that the planner has in his or her plant or refinery. Multiple runtime models can be selected to represent multiple reactors and multiple reactor configurations. Running the runtime models at 250 allows for automatic or manual updating of the planning model. The algorithm or process 250 for running the runtime models to update the planning model is further detailed in FIG. 2c, below. Once the updated planning model is created, it can be applied to the plant or refinery to increase efficiency 260. Efficiency is increased because, for example, the planning model now, as updated, more closely matches with the real plant behavior.

FIG. 2b is a flow chart illustrating creation of the runtime models 230. At 205, a template 100 is selected based on reactor type and configuration within that reactor type that corresponds to the reactor. The selected template 100 thus corresponds to the subject reactor configuration of interest in a processing plant, as described in FIG. 1, above. The templates can originate from a template database or any template source. The templates can cover the most common variations of reactor configurations used by planners.

Each template has a set of pre-defined independent variables (IVs) and a set of pre-defined dependent variables (DVs) which correspond to, for example, feed inputs and product outputs of a reactor. The set of pre-defined independent variables and the set of pre-defined dependent variables are selected based on their importance to real-world model behavior. For example, the set of pre-defined independent variables and dependent variables could be selected because these variables are the most common ones manipulated by planners creating a planning model in a processing plant.

At 210, a rigorous reactor model is created. A rigorous reactor model is a model that identifies substantially all independent variables and dependent variables for a given reactor. Specifically, the rigorous reactor model comprises the set of pre-defined independent variables and dependent variables from the identified template of 205. A rigorous reactor model can be developed via a modeling program such as, for example, Applicant's Process Simulation software HYSYS™. Once the rigorous reactor model is constructed, the model is run 215, using a simulator, with possible candidate values for the sets of pre-defined independent variables, and dependent variables are calculated. Running the simulation allows for the identification of a set of relationships between the pre-defined set of independent variables and dependent variables. In an example embodiment, the relationships can be linear. In another embodiment, the relationships can be non-linear. In another embodiment, the relationships can be a combination of linear and non-linear. At 220, the runtime model is constructed using the identified set of relationships between the pre-defined independent variables and dependent variables.

The runtime models can also include a set of tuning factors. The set of tuning factors allow a planner to modify the runtime model to match the plant or reactor configuration that the planner is using in the plant or refinery. The tuning factors are described in more detail below with respect to FIG. 2c and in the section labeled "Tuning Factors," below. Once the runtime models are created 220, they are stored in a database 240. The runtime models stored in the database can be organized, for example, according to reactor type.

FIG. 2c is a flow chart illustrating selecting a plurality of runtime models and updating a planning model using the selected runtime models 250. As described above, the planner creates a planning model that corresponds to the configuration of a plurality reactors in a plant 252. The planner then receives, from a database (resulting from 240), at least one of a plurality of runtime models corresponding to at least one of the reactors in the plant 255. The database of runtime models can be, for example, a commercially sold software package, or a collection of runtime models that are stored in a cloud computing system or the like. The planner can optionally use the set of tuning factors to adjust the runtime model to match the observed behavior of the reactors within the planner's plant 259. For example, the planner can adjust the set of tuning factors according to advanced process control model information. The advanced process control information can include steady-state gains or it can include a base operating point. In another example, the tuning factors can be adjusted according to historical data of plant operations.

At 257, the runtime models that were selected are run, which updates the set of planning model parameters within the planning model. In one example embodiment, the planner can directly incorporate the set of model parameters directly updated from the runtime model into the planning model. Alternatively, the runtime models can generate a dataset about the corresponding reactor. The planner can then use the dataset to update the model parameters of the planning model such that the set of planning model parameters correspond to real-world behavior of the plurality of reactors in the plant. In another example embodiment, a plurality of linear relationships can be generated from the runtime models when they are run. These linear relationships can also be directly incorporated into the planning model. The planner can then, at 260, apply the updated planning model to increase efficiency in the plant.

Use of a runtime model can provide the following characteristic advantages:
a. Capacity to capture a nonlinear relationship between input and output of a reactor;
b. Computational efficiency;
c. Capacity to solve all "practical" operating conditions irrespective of the current model state;
d. Capacity to be readily understood and used by planners and engineers without requiring a high-level of expertise;

e. Capacity to enforce material balance around the reactors both at the overall level and for specific elements (e.g., sulfur or hydrogen);
f. Capacity to encapsulate stream flows and qualities;
g. Capacity to identify tuning factors that allow outputs to be adjusted to align with actual plant performance.

As stated above, the runtime models for a specific reactor can differ in the feed type processed, the primary product produced, the number of products produced, and the mode of operation (e.g., continuous or semi-regenerated). To build a runtime model for a specific reactor, input and output variables are first identified. Example input variables for a runtime model can be the feed flow rate, the feed properties (e.g., density, average boiling temperature, aromatics percentage, contaminants concentration, etc.), and reactor operating parameters (e.g., reactor temperature or product cut temperatures). Example output variables can be product flow rates, product properties (e.g., density, octane number, cetane number, reid vapor pressure, aromatics percentage, contaminants concentration, viscosities), and reactor operating variables (e.g., burning air flow, coke on catalyst, and conversion).

Figure 3:
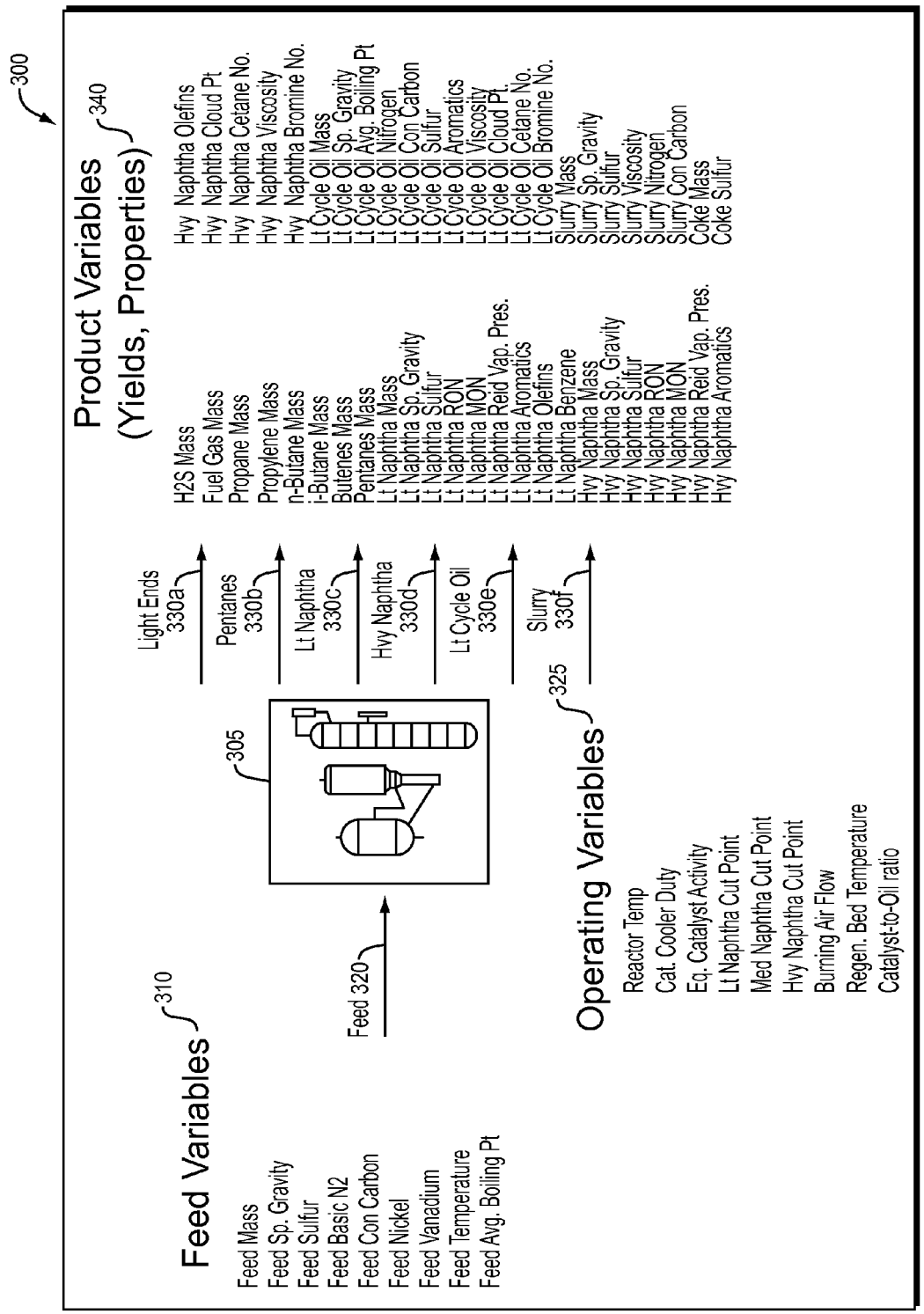
FIG. 3 is a screenview of a list of independent and dependent variables for an example template or reactor in an example embodiment of the present invention.

FIG. 3 is a screenview of the list of independent and dependent variables in an example runtime model 300 for an example reactor 305. Once the variable selections are made, the necessary relationships between the feed variables 310 and the product variables 340 to create the necessary runtime model are determined. These relationships, as described above, can be extrapolated from the rigorous reactor models. As described above, the rigorous models are based on these first principles, and therefore generate reliable and consistent databases which allow for extrapolation of functional forms of the model of the reactor. The data can be generated by, for example, Aspen Technology Inc.'s Process Simulation Software HYSYS™, which can be set up to run several case runs over the rigorous model and create a resulting dataset. Each data point in the dataset is generated by varying the input variables 320 from their minimum values to their maximum values in steps, and then the model (with operating variables 325) is solved to identify the corresponding output variable 330a-f. The inputs are varied so that every practically sensible combination of input values is included in the resulting dataset (e.g., substantially all variable combinations are calculated). A dataset can contain, for example, between 1000 and 10000 data points, depending on the reactor being modeled.

Once the dataset is generated, it can be used for training in Neural Networks (NN), with one network generated per output variable. The input variables are fed into the input nodes of the NN and each data point in the dataset is used to train the NN by, for example, calculating the hidden parameters within the network, such that the output predicted from the network matches with the variable's value for that data point in the dataset. An example Neural Network can be constructed by software such as Aspen Technology Inc.'s Aspen IQ™. The example NN can have the following characteristics:

a) Each network is a multiple-input-single-output (MISO) network;
b) There is one hidden layer in the network configuration;
c) A sigmoidal transfer function is used; and
d) A training algorithm using monotonicity constraints (such as, for example, enforcing bounded derivatives).

If the output variables of the datasets appear to have a simple linear relationship with the input variables, simple empirical equations can be employed instead of relying on a complex neural network.

The NN relationships between the inputs and outputs can be embedded as an Equation-Oriented model. The run time model can support more than input-output relationships, such as, for example, material balance and element balance equations. An element balance equation can be, for example, an equation that will account, stoichiometrically, for the amount of an element that is fed into the reactor. For example, if 1 kg/hr of sulfur enters the reactor through the feed, an elemental balance equation can force the reactor to output products whose combined sulfur should add up to 1 kg/hr. Other elements can also be balanced, such as, for example, hydrogen, or nitrogen. Additionally, the runtime model can comprise a set of tuning factors via a tuning equation which makes adjustments to the Neural Network predictions through the tuning factors, which are computed during the model tuning step. The tuning factors are described in more detail below with respect to FIG. 5.

Figure 4:
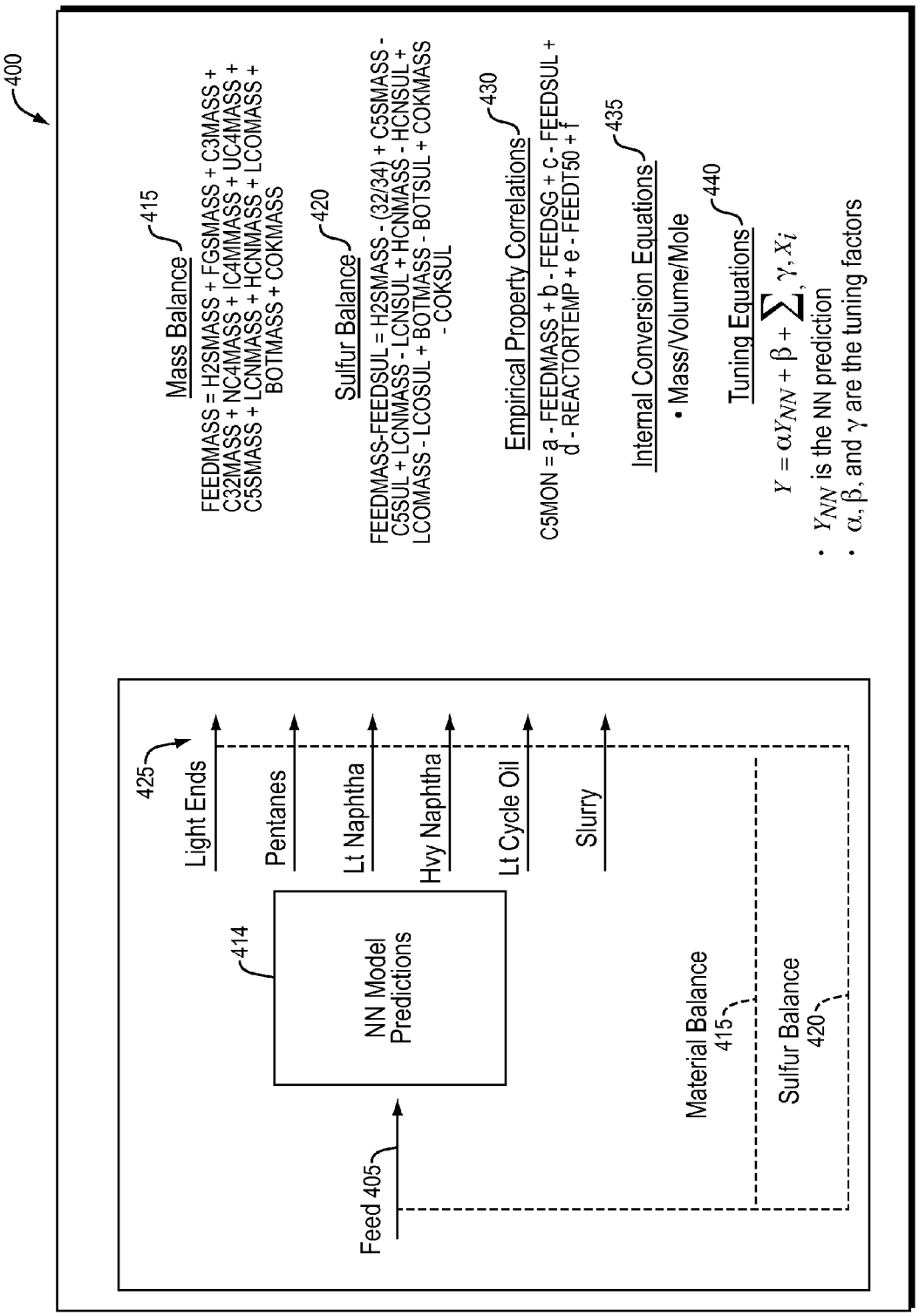
FIG. 4 is a screenview, in one example embodiment, of model equations and variable relationships used in a runtime model of a corresponding reactor.

FIG. 4 is a screenview showing example equations used in a runtime model 400. In the example runtime model 400, the feed (input variables) 405 are input into the NN Model 410, and the products (output variables) 425, are calculated using the NN Model Predictions 410. The NN Predictions are then adjusted so as to satisfy material balance equations 415 and the sulfur balance equations 420. For some output variables empirical property correlations 430 are used instead of the NN predictions. In addition there are additional internal conversion equations 435. By default all the flows predicted by the NN models are in mass basis, but the user prefers to have flows calculated from the runtime model to be in mass, volume or molar basis. The conversion equations 435 are meant for doing those conversions. Finally the tuning equations 440 are calculated by the runtime model to produce the results as per user plant data.

Figure 5:
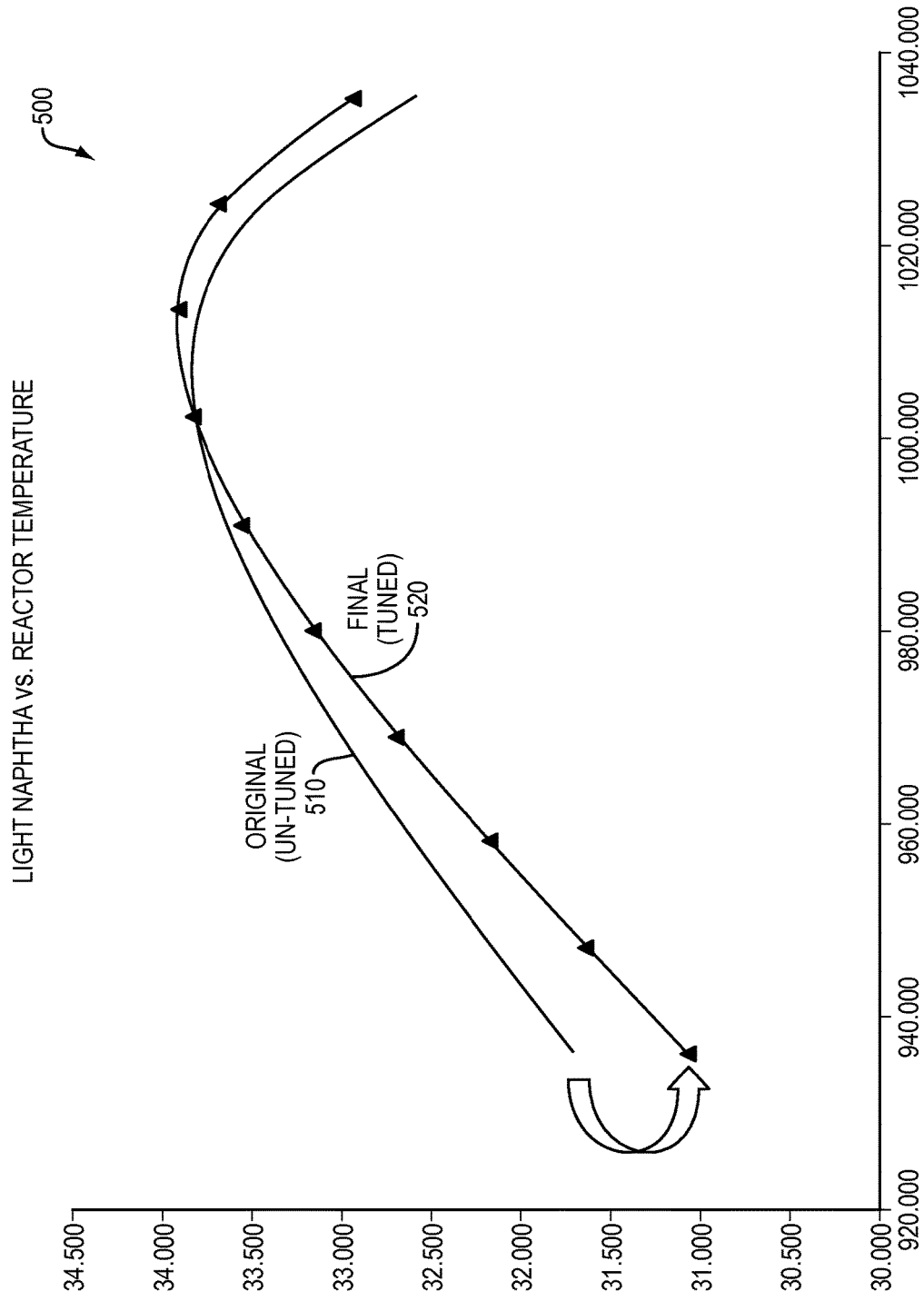
FIG. 5 is a plot of light naphtha as a function of reaction temperature, where the curve labeled "original" is prior to adjustment by the method, apparatus, or computer program product of the present invention, and the curve labeled "final" has been adjusted by the method, apparatus, or computer program product of the present invention.

While the runtime models can accurately capture the nonlinearities inherent with the reactors, they may require minor adjustments so that the runtime model more closely matches plant data, as each refinery is different. Therefore, the runtime models comprise tuning factors which are computed such that the model predictions can be adjusted to match actual user data (i.e., so that behavior of the model more closely matches or captures working behavior of the associated reactor). For example, FIG. 5 is a plot 500 of light naphtha as a function of reaction temperature, where curve 510 is prior to adjustment by the method, apparatus, or computer program product of the present invention, and curve 520 has been adjusted.

Tuning Factors

Tuning is done by using a formula similar to Formula (I) below:

$$Y_{tuned} = \alpha Y_{original}(X_i) + \beta + \Sigma_i \gamma_i X_i \quad (I)$$

Where $X_i$'s are input variables, $Y_{original}$ is the NN model prediction, and $Y_{tuned}$ is final runtime model prediction. So there are as many of these tuning equations as the number of NN model outputs.

Formula (I) can be used in conjunction with the example curve seen in FIG. 5. As used in Formula (I), $\alpha$ allows for adjustment of the curve shape, $\beta$ allows for adjustment of the bias, and $\Sigma_i \gamma_i X_i$ allows for adjustment of the linear shift.

Tuning can be done automatically by the system, where the parameters are automatically determined by an algorithm that attempts to minimize the error between the model prediction ($Y_{tuned}$) and the user data ($Y_{measured}$). That is, the $X_i$'s are known and $Y_{measured}$ are known, and $\alpha$, $\beta$, and $\gamma$'s are calculated so as to minimize the error between $Y_{tuned}$ values and $Y_{measured}$ values. The user data can be derived from actual plant data (e.g., found in data historians or lab information systems, etc.), or it can be data generated in a process simulation application. After tuning when the model is running in prediction mode, $X_i$'s, $\alpha$, $\beta$, and $\gamma$'s are known and the $Y_{measured}$ is calculated.

Additionally, an Advanced Process Control (APC) model can also be used as a source of information for tuning the runtime model. The APC model provides slopes or steady-state gains of inputs and outputs at a given operating point. The $\alpha$, $\beta$, and $\gamma$ parameters in Formula (I) can be adjusted so as to match the base operating condition and slopes from the APC model.

Figure 6:
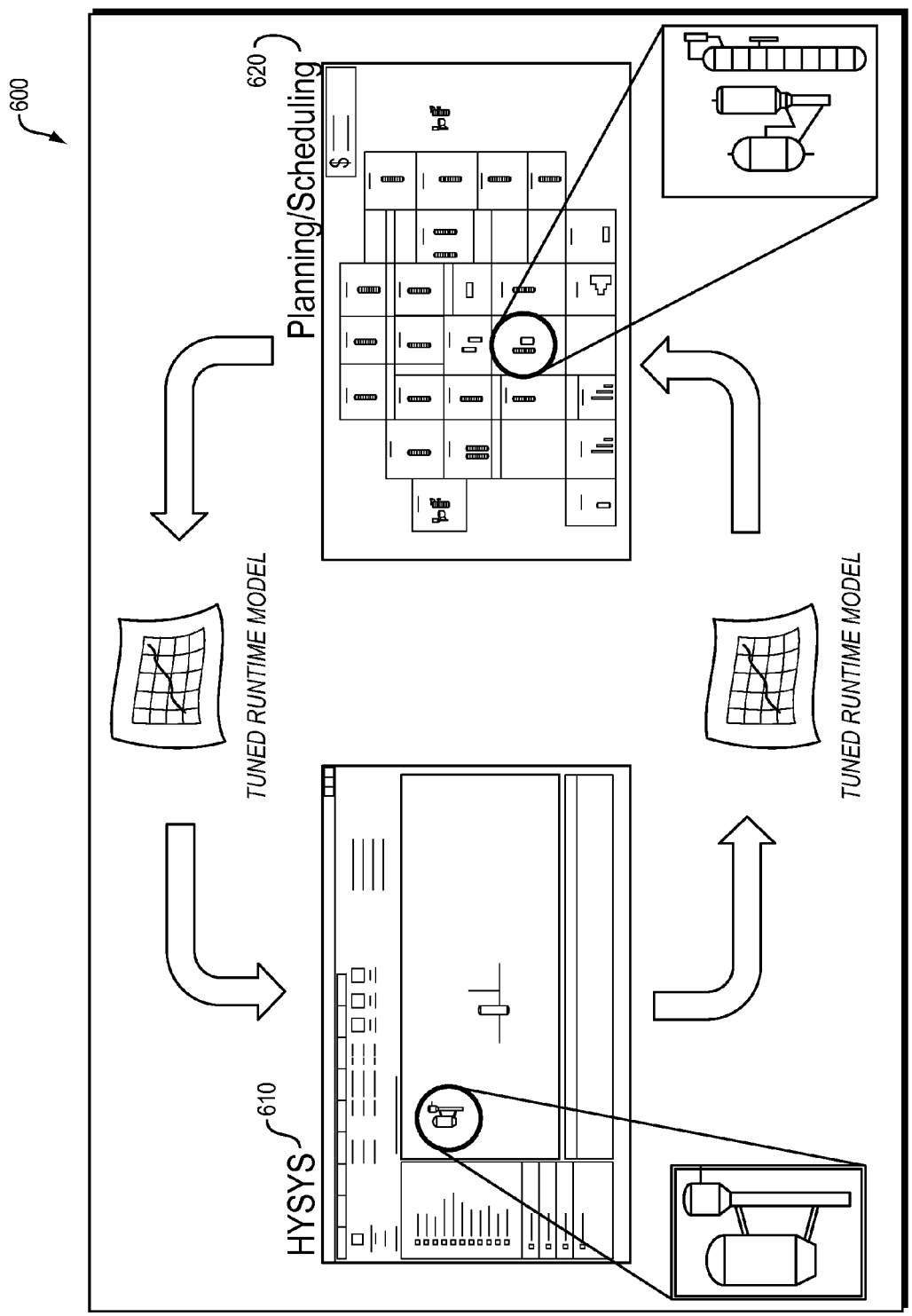
FIG. 6 is a schematic illustration of the exchange cycle of a tuned runtime model between an engineering environment and a planning environment in example embodiments of the present invention.

FIG. 6 illustrates an example life cycle of the workflow 600 of sharing runtime models between an engineering domain and a planning domain. While a rigorous model would require a high-level understanding of what is occurring within a specific reactor, the runtime model can be readily understood by more users. For example, if a process engineer has a rigorous simulation model in the simulation application 610 that is configured and calibrated to match plant data, he or she could configure a runtime model by selecting a model from the database whose configuration best matches with the rigorous model. The calibrated rigorous model could be used to generate simulation results, which would be treated as user data for tuning the runtime model. The generation of simulation results and subsequent tuning can be done automatically or with minimum user intervention. After the tuning, the runtime model can have same behavior as the rigorous engineering model. The tuned runtime model can then be exported as a file from the simulation application 610.

The same model could now be imported in the planning application 620, and then be used either for updating a linear planning reactor model or for direct embedding into a nonlinear refinery-wide planning model.

Alternatively, if a planner has access to plant data either coming from a data historian or other sources, he or she could configure a runtime model in the planning application 620 by selecting a model from the database, and then using the user data or plant data for tuning the runtime model. After the tuning, the runtime model would try to match with the plant data but still retain its native functional behavior. The tuned runtime model could be used in the planning application 620 for update or linear models or direct embedding into nonlinear refinery-wide planning model. The same tuned model could also be exported as a file from the planning application 620.

The exported model can now be imported in the simulation application 610, and then be used for validating a rigorous engineering model. Since the rigorous models are complex and difficult to use, they are not calibrated frequently. The tuned runtime model could be used as a reference model to test the validity of the rigorous model calibration.

Figure 7:
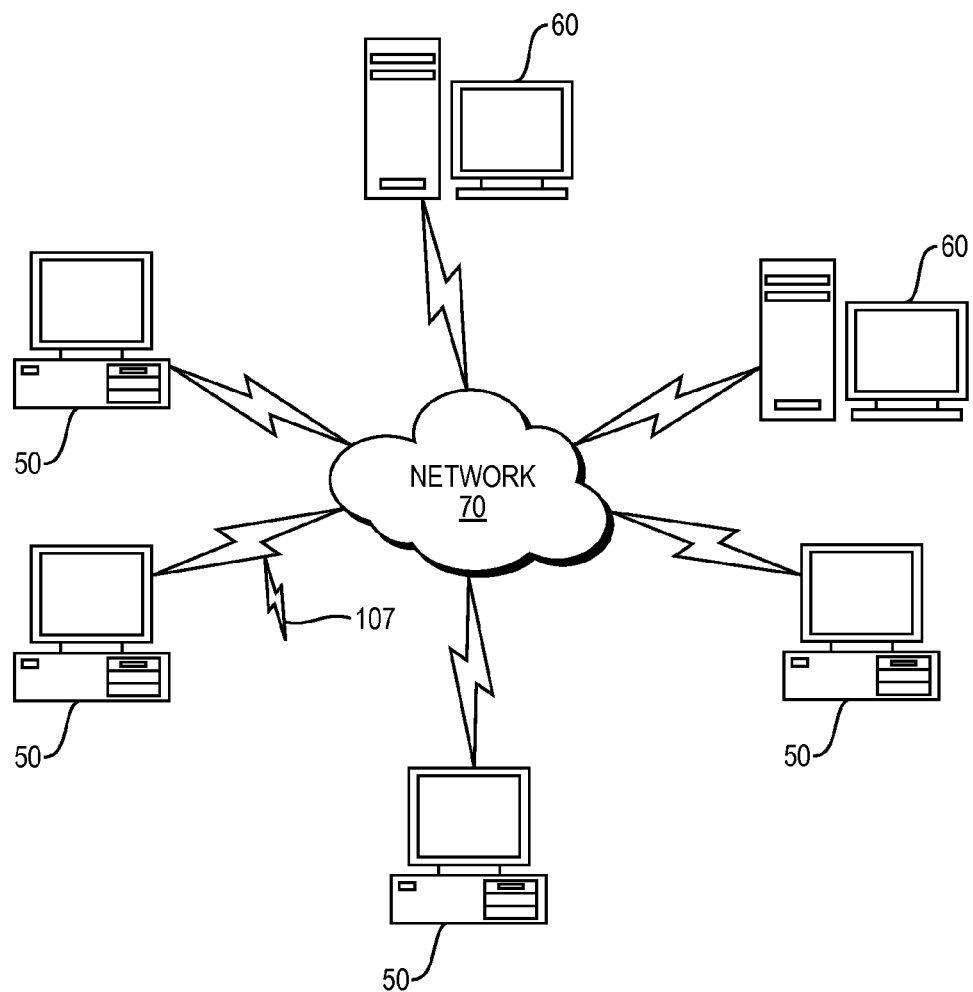
FIG. 7 illustrates a computer network or similar digital processing environment in which embodiments of the present invention may be implemented.

FIG. 7 illustrates a computer network or similar digital processing environment in which the present invention may be implemented.

Client computer(s)/devices 50 and server computer(s) 60 provide processing, storage, and input/output devices executing application programs and the like. Client computer(s)/devices 50 can also be linked through communications network 70 to other computing devices, including other client devices/processes 50 and server computer(s) 60. Communications network 70 can be part of a remote access network, a global network (e.g., the Internet), a worldwide collection of computers, Local area or Wide area networks, and gateways that currently use respective protocols (TCP/IP, Bluetooth, etc.) to communicate with one another. Other electronic device/computer network architectures are suitable.

Figure 8:
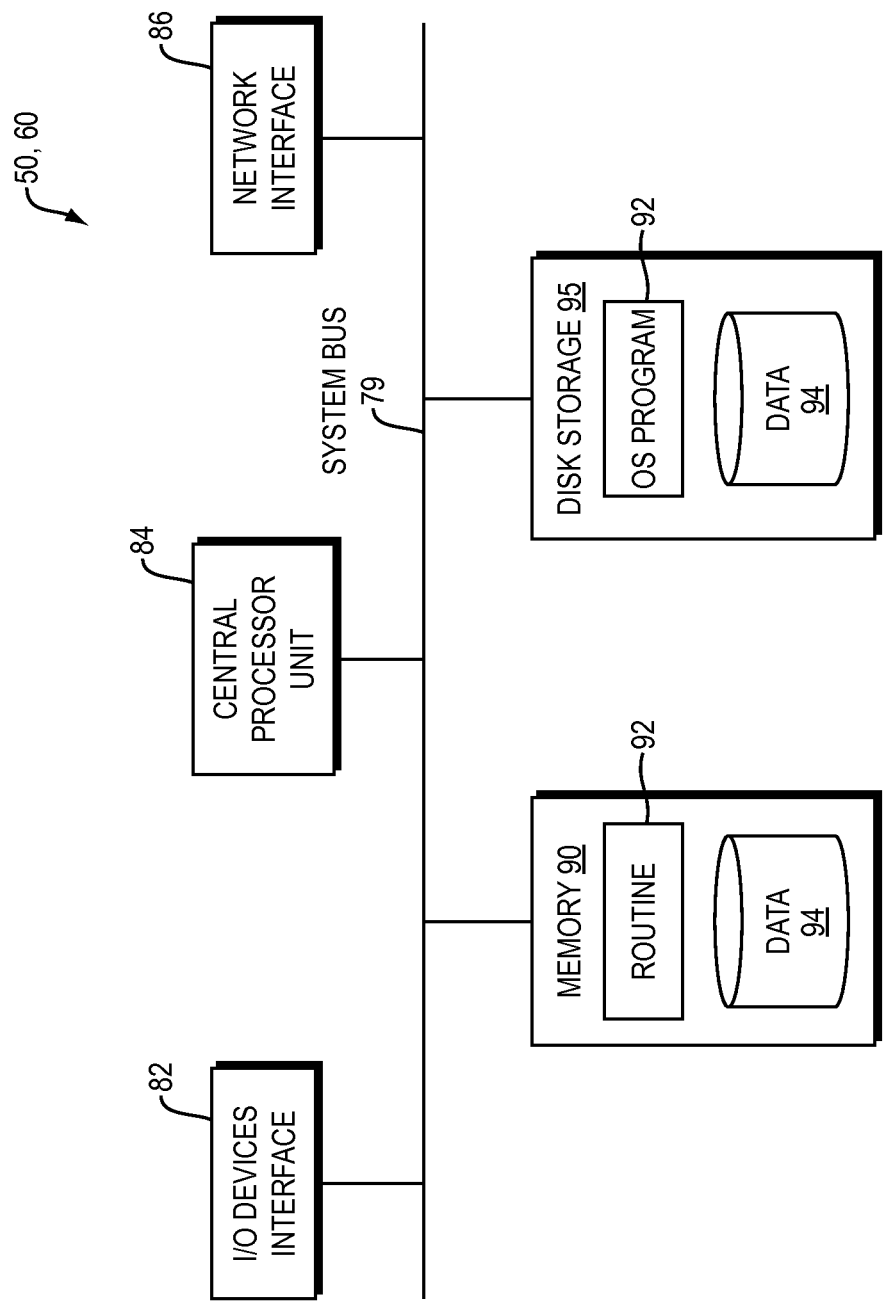
FIG. 8 is a diagram of the internal structure of a computer (e.g., client processor/device or server computers) in the computer system of FIG. 7.

FIG. 8 is a diagram of the internal structure of a computer (e.g., client processor/device 50 or server computers 60) in the computer system of FIG. 7. Each computer 50, 60 contains system bus 79, where a bus is a set of hardware lines used for data transfer among the components of a computer or processing system. Bus 79 is essentially a shared conduit that connects different elements of a computer system (e.g., processor, disk storage, memory, input/output ports, network ports, etc.) that enables the transfer of information between the elements. Attached to system bus 79 is I/O device interface 82 for connecting various input and output devices (e.g., keyboard, mouse, displays, printers, speakers, etc.) to the computer 50, 60. Network interface 86 allows the computer to connect to various other devices attached to a network (e.g., network 70 of FIG. 7). Memory 90 provides volatile storage for computer software instructions 92 and data 94 used to implement an embodiment of the present invention. Disk storage 95 provides non-volatile storage for computer software instructions 92 and data 94 (such as template source 100, runtime model database 240, runtime creation process 230, runtime model use 200, and updating planning model process 250) used to implement an embodiment of the present invention. Central processor unit 84 is also attached to system bus 79 and provides for the execution of computer instructions.

In one embodiment, the processor routines 92 and data 94 are a computer program product (generally referenced 92), including a computer readable medium (e.g., a removable storage medium such as one or more DVD-ROM's, CD-ROM's, diskettes, tapes, etc.) that provides at least a portion of the software instructions for the invention system. Computer program product 92 can be installed by any suitable software installation procedure, as is well known in the art. In another embodiment, at least a portion of the software instructions may also be downloaded over a cable, communication and/or wireless connection. In other embodiments, the invention programs are a computer program propagated signal product 107 embodied on a propagated signal on a propagation medium (e.g., a radio wave, an infrared wave, a laser wave, a sound wave, or an electrical wave propagated over a global network such as the Internet, or other network (s)). Such carrier medium or signals provide at least a portion of the software instructions for the present invention routines/program 92.

In alternate embodiments, the propagated signal is an analog carrier wave or digital signal carried on the propagated medium. For example, the propagated signal may be a digitized signal propagated over a global network (e.g., the Internet), a telecommunications network, or other network. In one embodiment, the propagated signal is a signal that is transmitted over the propagation medium over a period of time, such as the instructions for a software application sent in packets over a network over a period of milliseconds, seconds, minutes, or longer. In another embodiment, the computer readable medium of computer program product 92 is a propagation medium that the computer system 50 may receive and read, such as by receiving the propagation medium and identifying a propagated signal embodied in the propagation medium, as described above for computer program propagated signal product.

Generally speaking, the term "carrier medium" or transient carrier encompasses the foregoing transient signals, propagated signals, propagated medium, storage medium and the like.

The teachings of all patents, published applications and references cited herein are incorporated by reference in their entirety.

While this invention has been particularly shown and described with references to example embodiments thereof, it will be understood by those skilled in the art that various changes in form and details may be made therein without departing from the scope of the invention encompassed by the appended claims.

What is claimed is:

1. A computer-implemented method increasing efficiency in a processing plant, the method comprising, by a processor:
    from a source of templates, identifying a template corresponding to a configuration of a reactor among a plurality of reactors in a processing plant, wherein each template in the source comprises a set of pre-defined independent variables and a set of pre-defined dependent variables, and different templates correspond to different reactors;
    creating a rigorous reactor model of the reactor corresponding to the identified template, said created rigorous reactor model comprising the set of pre-defined independent variables and the set of pre-defined dependent variables in the identified template;
    using a simulator, running the created rigorous reactor model with possible candidate values for the set of pre-defined independent variables and the set of pre-defined dependent variables to identify a set of relationships of the rigorous reactor model between the set of pre-defined independent variables and the set of pre-defined dependent variables, wherein the identified set of relationships of the rigorous reactor model extrapolate input-output behavior of the rigorous reactor model of the reactor, the identified set of relationships capturing real-world behavior of the reactor in a simplified form;
    building a runtime model of reduced order based on the identified set of relationships of the rigorous reactor model between the set of pre-defined independent variables and the set of pre-defined dependent variables; and
    storing the reduced order runtime model on a database;
    wherein the stored reduced order runtime model further comprises a set of tuning factors, wherein the tuning factors enable adjusting the runtime model to closely align the runtime model with the real-world behavior of the reactor, and
    wherein running the reduced order runtime model from the database updates a planning model, the updated planning model having parameters that correspond to real-world behavior of the plurality of reactors in the processing plant; and
    forcing a change of the real-world behavior and output of the plurality of reactors in the processing plant by applying the updated planning model, the forced change of the real-world behavior increasing efficiency in the processing plant.

2. The method of claim 1, wherein running at least one of the runtime models results in material balance for the corresponding reactor.

3. The method of claim 1, wherein running at least one of the runtime models results in elemental balance for the corresponding reactor.

4. The method of claim 1, wherein the runtime models are shared between an engineering environment and a planning environment.

5. The method of claim 1, wherein the runtime models in the database are organized according to reactor type.

6. The method of claim 1, wherein the templates correspond to the configuration of a reactor selected from one of the following: a fluid catalytic cracking unit, a hydrocracker, a coker, a reformer, and a visbreaker.

7. The method of claim 1, the method further comprising creating a plurality of linear relationships from the runtime models.

8. A computer-implemented method of increasing efficiency in a processing plant, the method comprising, by a processor:
    creating a planning model comprising a set of model parameters that models a configuration of a plurality of reactors in the processing plant, each reactor having respective rigorous reactor model comprising a set of pre-defined independent variables and a set of pre-defined dependent variables;
    receiving, from a database, at least one of a plurality of runtime models of reduced order corresponding to at least one of the reactors, different reduced order runtime models in the database corresponding to different reactors, wherein for each received reduced order runtime model corresponding to the one reactor, the reduced order runtime model is based on a set of relationships of the rigorous reactor model between the set of pre-defined independent variables and the set of pre-defined dependent variables that correspond to real-world behavior of the one reactor, and a set of tuning factors, wherein:
        the set of relationships of the rigorous reactor model extrapolate input-output behavior of the rigorous reactor model of the one reactor, the set of relationships capture real-world behavior of the one reactor in a simplified form, and
        the tuning factors enable adjusting the runtime model to closely align the runtime model with the real-world behavior of the one reactor;
    running the received reduced order runtime models to update the set of model parameters such that the set of model parameters correspond to real-world behavior of the plurality of reactors in the processing plant, thereby creating an updated planning model; and
    forcing a change of the real-world behavior and output of the plurality of reactors in the processing plant by applying the updated planning model, the forced change of the real-world behavior increasing efficiency in the processing plant.

9. The method of claim 8, wherein the runtime models are incorporated directly into the planning model.

10. The method of claim 8, wherein prior to running the received runtime models, tuning the received runtime models by adjusting the set of tuning factors such that the runtime models correspond to real-life behavior of one of the plurality of reactors.

11. The method of claim 8, wherein running the received runtime models produces a dataset corresponding to real-world behavior of the plurality of reactors in the processing plant.

12. The method of claim 11, the set of planning model parameters are updated using the produced dataset.

13. The method of claim 8, wherein, prior to running the received runtime models, tuning the runtime models by adjusting the set of tuning factors are according to advanced process control model information.

14. The method of claim 13, wherein the advanced process control model information includes steady-state gains.

15. The method of claim 13, wherein the advanced process control model information includes a base operating point.

16. The method of claim 8, wherein, prior to running the received runtime models, tuning the runtime models by adjusting the set of tuning factors according to historical data of the plant to increase the efficiency of the processing plant.

17. The method of claim 8, wherein the plurality of runtime models in the database are organized according to reactor type.

18. The method of claim 8, wherein each of the plurality of reactor models is selected from one of the following: a fluid catalytic cracking unit, a hydrocracker, a coker, a reformer, and a visbreaker.

19. The method of claim 8, the method further comprising creating a plurality of linear relationships from the runtime models.

20. The method of claim 19, wherein the plurality of linear relationships are incorporated into the planning model.

21. A computer-implemented method of increasing efficiency in a processing plant, the method comprising, by a processor:
creating a planning model that employs a set of model parameters and models a configuration of a plurality of reactors in a processing plant;
receiving, from a database, at least one of a plurality of runtime models of reduced order corresponding to at least one of the plurality of reactors, different reduced order runtime models corresponding to different reactors, the different reduced order runtime models correspond to different rigorous reactor models of the reactors, wherein for each reduced order runtime model in the database, the reduced order runtime model comprises a respective set of relationships of a rigorous reactor model between a set of pre-defined independent variables and a set of pre-defined dependent variables that correspond to real-world behavior, and a respective set of tuning factors, the received reduced order runtime models corresponding to one reactor being created by:
from a source of templates, identifying a template corresponding to a configuration of the one reactor, wherein each template comprises the respective set of pre-defined independent variables and the respective set of pre-defined dependent variables;
creating a rigorous reactor model of the one reactor, said created rigorous reactor model comprising the set of pre-defined independent variables and the set of pre-defined dependent variables in the identified template, the identified set of relationships of the rigorous reactor model extrapolating input-output behavior of the rigorous reactor model of the one reactor, the identified set of relationships capturing real-world behavior of the one reactor in a simplified form;
using a simulator, running the created rigorous reactor model with possible candidate values for the set of pre-defined independent variables and the set of pre-defined dependent variables to identify a set of relationships of the rigorous reactor model between the set of pre-defined independent variables and the set of pre-defined dependent variables;
building the reduced order runtime model based upon the identified set of relationships of the rigorous reactor model between the set of pre-defined independent variables and the set of pre-defined dependent variables; and
storing the reduced order runtime model on the database,
wherein the stored reduced order runtime model further comprises a set of tuning factors, wherein the tuning factors enable adjusting the runtime model to closely align the runtime model with the real-world behavior of the one reactor;
running the received runtime models and updating the planning model by updating the set of model parameters such that the updated set of model parameters correspond to real-world behavior of the plurality of reactors in the processing plant; and
forcing a change of the real-world behavior and output of the plurality of reactors in the processing plant by applying the updated planning model, the forced change of the real-world behavior increasing efficiency in the processing plant.

22. An apparatus for increasing efficiency in a processing plant, the apparatus comprising:
computer memory; and
a computer means coupled to the computer memory and executed by a processor, the computer means configured to:
create a planning model comprising a set of model parameters that models a configuration of a plurality of reactors in processing plant, each reactor having a respective rigorous reactor model comprising a set of pre-defined independent variables and a set of pre-defined dependent variables;
receive, from a database, at least one of a plurality of runtime models of reduced order corresponding to at least one of the reactors, different reduced order runtime models in the database corresponding to different reactors, wherein for each received reduced order runtime model corresponding to the one reactor, the runtime model is based on a set of relationships of the rigorous reactor model between the set of pre-defined independent variables and the set of pre-defined dependent variables that correspond to real-world behavior of the one reactor, and a set of tuning factors, wherein:
the set of relationships of the rigorous reactor model extrapolate input-output behavior of the rigorous reactor model of the reactor model, the set of relationships capture real-world behavior of the one reactor in a simplified form, and
the tuning factors enable adjusting the runtime model to closely align the runtime model with the real-world behavior of the one reactor;
run the received reduced order runtime models to update the set of model parameters such that the set of model parameters correspond to real-world behavior of the plurality of reactors in the processing plant, thereby creating an updated planning model; and
force a change of the real-world behavior and output of the plurality of reactors in the processing plant by applying the updated planning model, the forced change of the real-world behavior increasing efficiency in the processing plant.

23. A computer program product for increasing efficiency in a processing plant, comprising:

a compute readable medium embodying program instructions, the program instructions, when executed by a digital processor, cause the digital processor to:

create a planning model comprising a set of model parameters that models a configuration of a plurality of reactors in the processing plant, each reactor having a respective rigorous reactor model comprising a set of pre-defined independent variables and a set of pre-defined dependent variables;

receive, from a database, at least one of a plurality of runtime models of reduced order corresponding to at least one of the reactors, different reduced order runtime models in the database corresponding to different reactors, wherein for each received reduced order runtime model corresponding to the one reactor, the runtime model is based on a set of relationships of the rigorous reactor model between the set of pre-defined independent variables and the set of pre-defined dependent variables that correspond to real-world behavior of the one reactor, and a set of tuning factors, wherein:

the set of relationships of the rigorous reactor model extrapolate input-output behavior of the rigorous reactor model, the set of relationships capture real-world behavior of the one reactor in a simplified form, and the tuning factors enable adjusting the runtime model to closely align the runtime model with the real-world behavior of the one reactor;

run the received reduced order runtime models to update the set of model parameters such that the set of model parameters correspond to real-world behavior of the plurality of reactors in the processing plant, thereby creating an updated planning model; and force a change of the real-world behavior and output of the plurality of reactors in the processing plant by applying the updated planning model, the forced change of the real-world behavior increasing efficiency in the processing plant.

* * * * *